United States Patent
Seghizzi et al.

(10) Patent No.: US 11,787,685 B2
(45) Date of Patent: Oct. 17, 2023

(54) PROCESS FOR MANUFACTURING AN OPTICAL MICROELECTROMECHANICAL DEVICE HAVING A TILTABLE STRUCTURE WITH AN ANTIREFLECTIVE SURFACE

(71) Applicant: STMicroelectronics S.r.l., Agrate Brianza (IT)

(72) Inventors: Luca Seghizzi, Milan (IT); Nicolo' Boni, Alzano Lombardo (IT); Laura Oggioni, Milan (IT); Roberto Carminati, Piancogno (IT); Marta Carminati, Casatenovo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 329 days.

(21) Appl. No.: 17/126,903

(22) Filed: Dec. 18, 2020

(65) Prior Publication Data
US 2021/0188620 A1 Jun. 24, 2021

(30) Foreign Application Priority Data
Dec. 20, 2019 (IT) .................. 102019000025042

(51) Int. Cl.
*B81B 3/00* (2006.01)
*B81C 1/00* (2006.01)

(52) U.S. Cl.
CPC .......... *B81B 3/0021* (2013.01); *B81C 1/0069* (2013.01); *B81C 2201/013* (2013.01); *B81C 2201/0156* (2013.01)

(58) Field of Classification Search
CPC ...... B81C 2201/013; B81C 2201/0156; B81C 1/00317; B81C 2203/0154;
(Continued)

(56) References Cited

U.S. PATENT DOCUMENTS 5,767,666 A 6/1998 Asada et al.
6,059,188 A 5/2000 diFazio et al.
(Continued)

FOREIGN PATENT DOCUMENTS

JP 2017191266 A 10/2017

OTHER PUBLICATIONS

IT Search Report and Written Opinion for IT Appl. No. 102019000025042 dated Sep. 11, 2020 (10 pages).

*Primary Examiner* — Shahed Ahmed
*Assistant Examiner* — Sun Mi Kim King
(74) *Attorney, Agent, or Firm* — CROWE & DUNLEVY

(57) ABSTRACT

For manufacturing an optical microelectromechanical device, a first wafer of semiconductor material having a first surface and a second surface is machined to form a suspended mirror structure, a fixed structure surrounding the suspended mirror structure, elastic supporting elements which extend between the fixed structure and the suspended mirror structure, and an actuation structure coupled to the suspended mirror structure. A second wafer is machined separately to form a chamber delimited by a bottom wall having a through opening. The second wafer is bonded to the first surface of the first wafer in such a way that the chamber overlies the actuation structure and the through opening is aligned to the suspended mirror structure. Furthermore, a third wafer is bonded to the second surface of the first wafer to form a composite wafer device. The composite wafer device is then diced to form an optical microelectromechanical device.

14 Claims, 14 Drawing Sheets

(58) Field of Classification Search
CPC ..... B81C 2203/0109; B81C 2203/0118; B81C 2203/0127; B81C 2203/0163; B81C 1/00269; B81C 1/0069; B81C 2203/036; B81C 1/00134; B81B 2201/042; B81B 3/0021; B81B 3/007; B81B 2201/032; B81B 2203/0163; B81B 2203/058; B81B 7/02; G02B 26/0858; G02B 26/0833; G02B 26/10; G03B 21/28
See application file for complete search history.

(56) References Cited

U.S. PATENT DOCUMENTS

| | | | |
|---|---|---|---|
| 2013/0001710 A1* | 1/2013 | Daneman | G02B 26/0833 |
| | | | 257/415 |
| 2015/0001651 A1* | 1/2015 | Faralli | B81C 3/00 |
| | | | 438/51 |
| 2015/0049374 A1 | 2/2015 | Hofmann et al. | |
| 2017/0160540 A1 | 6/2017 | Giusti et al. | |
| 2019/0161342 A1* | 5/2019 | Tai | B81B 7/02 |
| 2019/0196177 A1 | 6/2019 | Carminati et al. | |

* cited by examiner

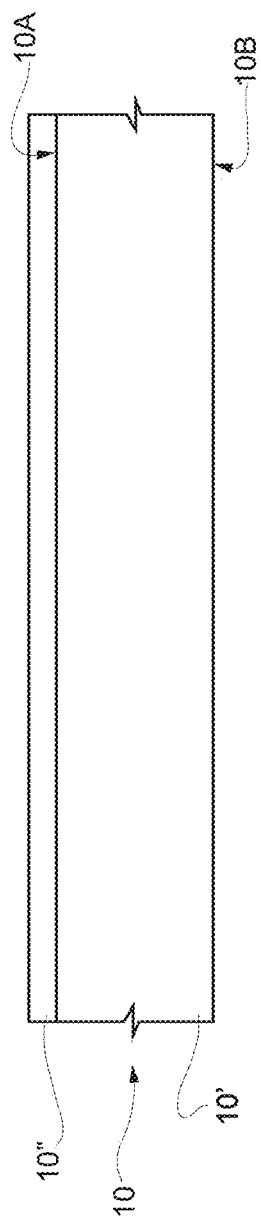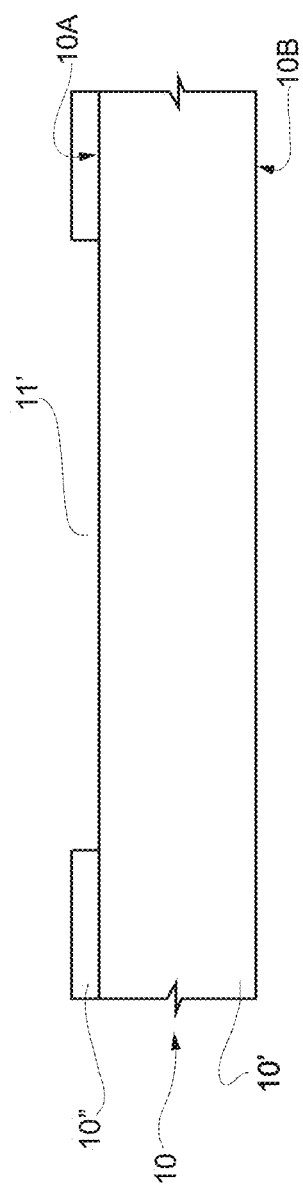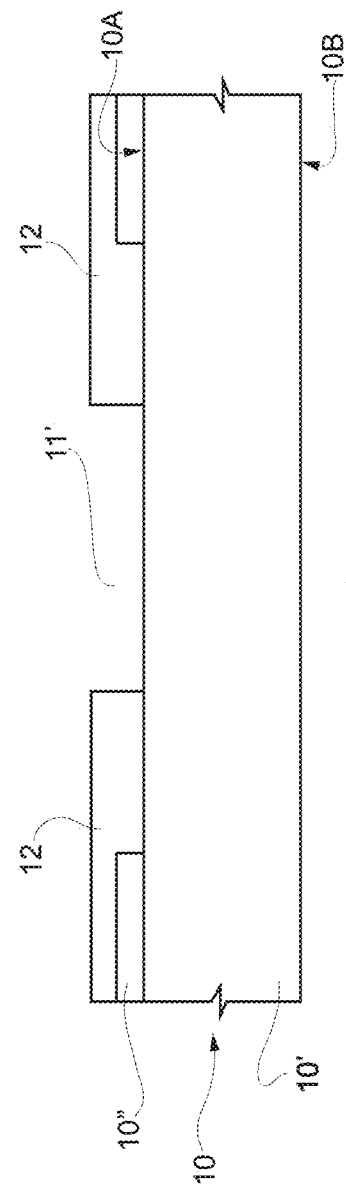

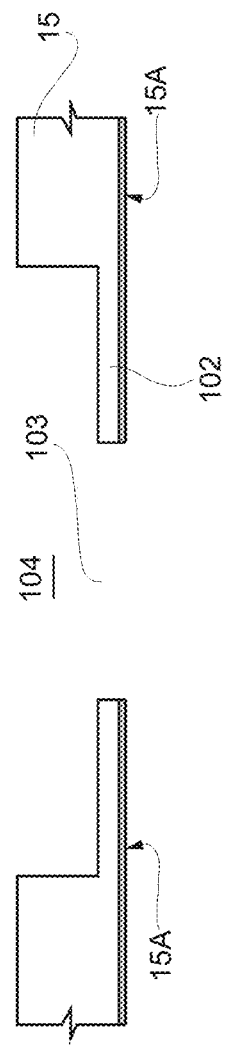
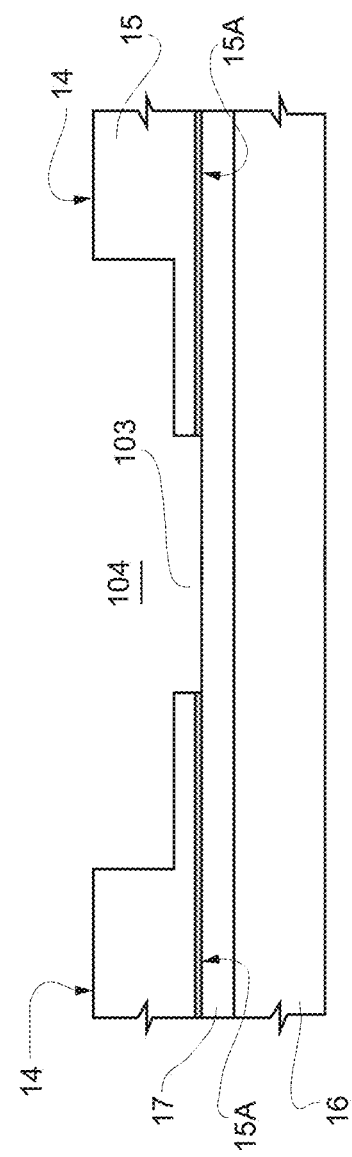
FIG. 5G
FIG. 5H

PROCESS FOR MANUFACTURING AN OPTICAL MICROELECTROMECHANICAL DEVICE HAVING A TILTABLE STRUCTURE WITH AN ANTIREFLECTIVE SURFACE

PRIORITY CLAIM

This application claims the priority benefit of Italian Application for Patent No. 102019000025042, filed on Dec. 20, 2019, the contents of which are hereby incorporated by reference in their entirety to the maximum extent allowable by law.

TECHNICAL FIELD

This disclosure relates to a process for manufacturing an optical micro-electro-mechanical device having a tiltable structure with an antireflective surface. In particular, reference will be made hereinafter to the manufacture of a micromirror, using MEMS (Micro Electro-Mechanical System) technology.

BACKGROUND

As is known, a micromirror may be produced starting from semiconductor material. The small dimensions of MEMS semiconductor devices enable, in fact, integration of said devices in portable apparatuses, such as augmented-reality and virtual-reality viewers, portable computers, laptops, notebooks, PDAs, tablets, mobile phones, and smartphones, for optical applications.

Typically, such microelectromechanical devices are inserted in miniaturized projector modules (so-called picoprojectors), which are able to project images at a distance or generate desired patterns of light and have, for example, the structure illustrated in FIG. 1.

FIG. 1 is a schematic illustration of a picoprojector 1 comprising a light source 2, typically a laser source, a light beam 3, a micromirror 4, and a screen 5. Here, the micromirror 4 directs the light beams 3 coming from the light source 2 onto the screen 5.

In the example illustrated in FIG. 1, the micromirror 4 is a mirror of a biaxial type, i.e., capable of rotating about two axes R' and R" that are mutually transverse, for example perpendicular to one another, to orient the light beams 3 onto a surface of the screen 5. Alternatively, it is possible to use two uniaxial mirrors, each capable of rotating only about one axis.

A micromirror obtained with MEMS technology generally comprises a reflective structure suspended over a cavity and elastically supported by arms that enable inclination or rotation thereof with respect to the resting plane. Movement of the micromirror is guaranteed by an actuation system that may, for example, be of an electrostatic, piezoelectric, or electromagnetic type.

Electrostatic actuation systems in general require high operating voltages, whereas electromagnetic actuation systems in general involve a high-power consumption. Consequently, piezoelectric actuation systems are increasingly used.

As example of a microelectromechanical mirror device with actuation of a piezoelectric type, reference may be made to United States Patent Application Publication No. 20200192199 (corresponding to Italian Patent Application No. 102018000011112, filed on Dec. 14, 2018, and European Patent Application No. 19165958.0, filed on Mar. 28, 2019), all of which are incorporated by reference, which describes a microelectromechanical mirror device comprising a micromirror, which can be either of a biaxial type or of a uniaxial type. A top plan view of one of the possible embodiments of the aforesaid microelectromechanical device is represented schematically in FIG. 2. In detail, the microelectromechanical device, designated by 20, is formed in a die of semiconductor material, in particular silicon, and is provided with a tiltable structure 22, which has a main extension in a horizontal plane XY of a cartesian reference system XYZ with origin at the center of the microelectromechanical device 20 and is arranged to rotate about an axis of rotation A, coinciding with a first horizontal axis X of the aforesaid horizontal plane XY (for example, said axis of rotation A corresponds to the axis of rotation R' represented in FIG. 1).

The tiltable structure 22 is suspended over a cavity 23, obtained in the die, and has, in the embodiment illustrated, a generically elliptical shape in the horizontal plane XY. The tiltable structure 22 carries, at the top, a reflective surface 22' to define a mirror structure 36.

The tiltable structure 22 is elastically coupled to a fixed structure 24, defined by the die itself. In particular, the fixed structure 24 forms, in the horizontal plane XY, a frame 24', having, for example, a substantially rectangular shape in the plane XY, which delimits and surrounds the aforesaid cavity 23. The frame 24' carries a first supporting element 25A and a second supporting element 25B, which extend along the axis X starting from the frame 24' itself and are suspended over the cavity 23 on opposite sides of the tiltable structure 22.

The tiltable structure 22 is supported by the first and second supporting elements 25A, 25B, to which it is elastically coupled by a first elastic suspension element 26A and a second elastic suspension element 26B, respectively.

The microelectromechanical device 20 further comprises an actuation structure 30, which is coupled to the tiltable structure 22 and is configured in such a way as to cause rotation thereof about the axis of rotation A. The actuation structure 30 is set between the tiltable structure 22 and the frame 24', and moreover contributes to supporting the tiltable structure 22 over the cavity 23.

The actuation structure 30 comprises four driving arms 32A-32D grouped together in two pairs. The first pair comprises a first driving arm 32A and a second driving arm 32B. The second pair comprises a third driving arm 32A and a fourth driving arm 32D. The two pairs are identical to one another and arranged symmetrically with respect to a second axis Y of the reference system XYZ.

Each driving arm 32A-32D is suspended over the cavity 23 and has a first end fixedly coupled to the frame 24' and a second end elastically coupled to the tiltable structure 22 by a respective elastic decoupling element 34A-34D. In addition, each driving arm 32A-32D carries, on a top surface thereof, opposite to the cavity 23, a respective actuation region 33 of a piezoelectric type.

As illustrated schematically in FIG. 2, the microelectromechanical device 20 further comprises a plurality of electrical contact pads 38, carried by the fixed structure 24 at the frame 24' and are electrically connected (in a way not illustrated in detail in FIG. 2) to the actuation regions 33 of the driving arms 32A-32D to enable electrical biasing thereof.

During operation of the microelectromechanical device 20, application of a biasing voltage V to the actuation regions 33 of the first and third driving arms 32A and 32C (having a positive value with respect to the biasing of the actuation regions 33 of the second and fourth driving arms 32B and 32D, which may, for example, be connected to a ground reference potential) causes a rotation of the mirror structure 36 in a first direction about the axis of rotation A.

Accordingly, application of a biasing voltage V to the actuation regions 33 of the second and fourth driving arms 32B and 32D (having a positive value with respect to the biasing of the actuation regions 33 of the first and third driving arms 32A and 32C, which may, for example, be connected to a ground reference potential) causes a rotation of the mirror structure 36 in an opposite direction about the axis of rotation A itself.

With reference to FIG. 3, the microelectromechanical device 20 is made up of two bodies: a sensor body 50 and a supporting body 49. In a possible implementation, a protective cap 51 is fixed to the microelectromechanical device 20.

The sensor body 50 has a generally parallelepipedal shape, which has a first surface 50A and a second surface 50B and houses the mirror structure 36 and the corresponding supporting elements 25A, 25B, the actuation structure 30, the elastic decoupling elements 34A-34D, and the elastic suspension elements 26A, 26B, described above with reference to FIG. 2.

The supporting body 49 is made, for example, of semiconductor material and is coupled to the second surface 50B of the sensor body 50 by a bonding layer 60 (for example, of silicon oxide) at the frame 24'. The supporting body 49 has a recess 61 facing the tiltable structure 22 in order to enable rotation thereof during use. The recess 61 has a bottom surface 61', which is generally blackened, for the reasons discussed below.

In the possible implementation considered, the protective cap 51 is made with molded plastic, for example having liquid-crystal polymers (LCPs), and is bonded to the first surface 50A of the sensor body 50. The protective cap 51 is substantially shaped like a cup turned upside down and has a chamber 54 closed at the top by a bottom wall 52 set at a distance from the first surface 50A of the sensor body 50. Moreover, the protective cap 51 has an opening 53 in the bottom wall 52 facing the reflective surface 22'. The bottom wall 52 and the opening 53 limit the light beam 62 that can reach the sensor body 50.

The blackened bottom surface 61' and the protective cap 51 that limits the light beam 62 allow the reflective properties of the microelectromechanical device 20 to be determined by the reflective surface 22' and by the movement of the tiltable structure 22 in use.

This is particularly useful in the case where the microelectromechanical device 20 is used within augmented-reality or virtual-reality viewers, or more in general in all those head-mounted systems (HMSs) or head-mounted displays (HMDs), where it is desired to obtain excellent optical properties, in particular reflective properties, in order to help guarantee optimal performance of the devices themselves and protect the safety of users.

In fact, especially regarding the safety of users, the exposed metal surfaces of the sensor structure 50 represent a concern. In particular, spurious reflections of the light rays incident on the microelectromechanical device 20 may focus accidentally on the retinas of users, causing irritation thereof.

However, meeting the above safety desires is not simple with the microelectromechanical device 20 described above, where the two bodies 49-50 are manufactured separately and bonded to the protective cap 51 in a final stage (the so-called back-end stage).

In detail, according to what has been described in the Italian patent application cited above, the sensor body 50 is obtained starting from a SOI (Silicon-On-Insulator) wafer 40, formed by two layers of semiconductor material (hereinafter referred to as first and second structural layers 40A, 40B), for example silicon, and by an intermediate insulating layer 40C, for example silicon oxide.

Defined by chemical etching in the first structural layer 40A (for example, having a thickness of 20 µm) are the tiltable structure 22, the fixed structure 24, the elastic decoupling elements 34A-34D, the elastic suspension elements 26A, 26B (not illustrated in FIG. 3), the supporting elements 25A, 25B (not illustrated in FIG. 3), and the driving arms 32A-32D. The cavity 23 is formed by chemical etching of selective portions of the second structural layer 40B (for example, having a thickness of 140 µm) and of the intermediate insulating layer 40C.

Underneath the tiltable structure 22, following upon etching for formation of the cavity 23, there remain reinforcement elements 41, which have an extension along an orthogonal axis Z of the reference system XYZ and have the function of mechanical reinforcement.

Formed on a top surface 40' of the first structural layer 40A of the SOI wafer 40 are: the reflective surface 22', at the tiltable structure 22, made of an appropriate material (for example, aluminum, or else gold, according to whether the projection is in the visible or in the infrared); and moreover bottom-electrode regions 42, made of an appropriate conductive material, at the driving arms 32A-32D.

Regions of piezoelectric material 43 (constituted by a thin film of PZT-Lead Zirconate Titanate) are then obtained on top of the bottom-electrode regions 42, and top-electrode regions 44 on top of the regions of piezoelectric material 43, thus forming the actuation regions 33.

A passivation layer 45, made of an appropriate dielectric material, is formed, as covering, on top of the actuation regions 33, and contact openings 46 are open through the passivation layer 45 to access the bottom-electrode regions 42 and the top-electrode regions 44.

Metal routing regions 47 are then formed on the passivation layer 45 to contact, through the contact openings 46, the bottom-electrode regions 42 and the top-electrode regions 44, moreover extending up to respective electrical-contact pads 38 (here not illustrated).

A further wafer of semiconductor material, for example silicon, configured to form the supporting body 49, is selectively etched to obtain the recess 61 and obtain blackening of the bottom surface 61' of the latter. For instance, in a way known to the person skilled in the art, the bottom surface 61' may be machined to increase the roughness thereof.

The further wafer of semiconductor material is then bonded to the SOI wafer 40 via the bonding layer 60, and the composite wafer is then diced to form the microelectromechanical device 20.

In the considered possible implementation, the protective cap 51 is molded by or on behalf of the manufacturer of the apparatus in which the microelectromechanical device 20 is to be mounted, who hence also fixes the protective body 51 to the microelectromechanical device 20.

As is evident from the foregoing, with said implementation, the process of fixing of the protective cap 51 (capping step), carried out in the back-end stage, is complex and is not standardized in so far as it is carried out in a factory different from that where the microelectromechanical device 20 is produced and depends upon the specific application and the technology used.

In addition, use of the protective cap 51 made of plastic in the back-end may easily result in problems of alignment with the microelectromechanical device 20, in particular between the opening 53 of the protective cap 51 and the tiltable structure 22 of the sensor body 50, causing defects of operation of the microelectromechanical devices.

Therefore, further development is needed to provide a microelectromechanical device that allows the drawbacks of the prior art to be overcome.

SUMMARY

Embodiments herein concern a process for manufacturing an optical microelectromechanical device and an optical microelectromechanical device.

Indeed, described herein is a process for manufacturing an optical microelectromechanical device, including: forming, in a first wafer of semiconductor material having a first surface and a second surface, a suspended mirror structure, a fixed structure, surrounding the suspended mirror structure, elastic supporting elements extending between the fixed structure and the suspended mirror structure, and an actuation structure coupled to the suspended mirror structure; forming, in a second wafer, a chamber delimited by a bottom wall having a through opening; bonding the second wafer to the first surface of the first wafer and a third wafer to the second surface of the first wafer so that the chamber overlies the actuation structure, and so that the through opening is aligned to the suspended mirror structure, thus forming a device composite wafer; and dicing the device composite wafer to form an optical microelectromechanical device.

Prior to bonding the third wafer to the second surface of the first wafer, the process may include forming, on the third wafer, an inner antireflective surface facing the suspended mirror structure.

Bonding the second wafer to the first surface of the first wafer may be carried out prior to the step of bonding the third wafer to the second surface of the first wafer.

Forming the chamber may include: in a work wafer having a first surface and a second surface, selectively removing portions of the work wafer starting from the first surface to form a first recess and a second recess, wherein the first recess is surrounded by the second recess and extends within the work wafer from the second recess; and thinning the work wafer from the second surface until reaching the first recess, to form the second wafer having the through opening and an outer surface opposite to the first surface.

The outer surface of the second wafer may undergo blackening to cause the outer surface to be absorbant or diffusive with respect to light.

Blackening may include increasing the roughness of the outer surface.

Blackening may include depositing absorbant or dielectric layers onto the outer surface.

The second wafer may be made of semiconductor material.

Forming a suspended mirror structure may include selective chemical etching to release the suspended mirror structure, the selective chemical etching being carried out after bonding the second wafer to the first surface of the first wafer.

Forming a suspended mirror structure may include selective chemical etching to release the suspended mirror structure, the selective chemical etching being carried out prior to bonding the third wafer to the second surface of the first wafer.

The actuation structure may be of a piezoelectric type.

A bottom surface of the second recess of the second wafer and a side wall of the first recess of the second wafer may form an angle $\alpha$ comprised between 10° and 90°.

Also disclosed herein is an optical microelectromechanical device, which may include: a sensor body of semiconductor material, having a first surface and a second surface and having a suspended mirror structure, a fixed structure surrounding the suspended mirror structure, elastic supporting elements extending between the fixed structure and the suspended mirror structure, and an actuation structure, coupled to the suspended mirror structure; a protective cap, of semiconductor material or glass, bonded to the first surface of the sensor body and having a chamber overlying the actuation structure, the chamber being delimited by a wall having a through opening and having an outer surface; the outer surface being absorbant or diffusive to light, and the through opening being aligned to the suspended mirror structure; and a supporting body bonded to the second surface of the sensor body.

The supporting body may have an inner antireflective surface facing the suspended mirror structure.

Also disclosed herein is a picoprojector apparatus for use in a portable electronic apparatus, including: a light source, which may be operated for generating a light beam as a function of an image to be generated; the optical microelectromechanical device described above; and a driving circuit configured to supply electrical driving signals for rotating the suspended mirror structure. This portable electronic apparatus may be a viewer for augmented-reality or virtual-reality.

BRIEF DESCRIPTION OF THE DRAWINGS

For better understanding, an embodiment is now described, purely by way of non-limiting example, with reference to the attached drawings, wherein:

FIGS. 4, 5A-5H, and 6-9 are cross-sectional views of wafers of semiconductor material in successive manufacturing steps of the microelectromechanical mirror device disclosed and described herein;

DETAILED DESCRIPTION

Described hereinafter are steps for manufacturing a microelectromechanical device, in particular a mirror device obtained with MEMS technology, which can be used in picoprojectors and can be inserted in mobile apparatuses, in particular mobile phones and augmented-reality and virtual-reality viewers.

Figure 1:
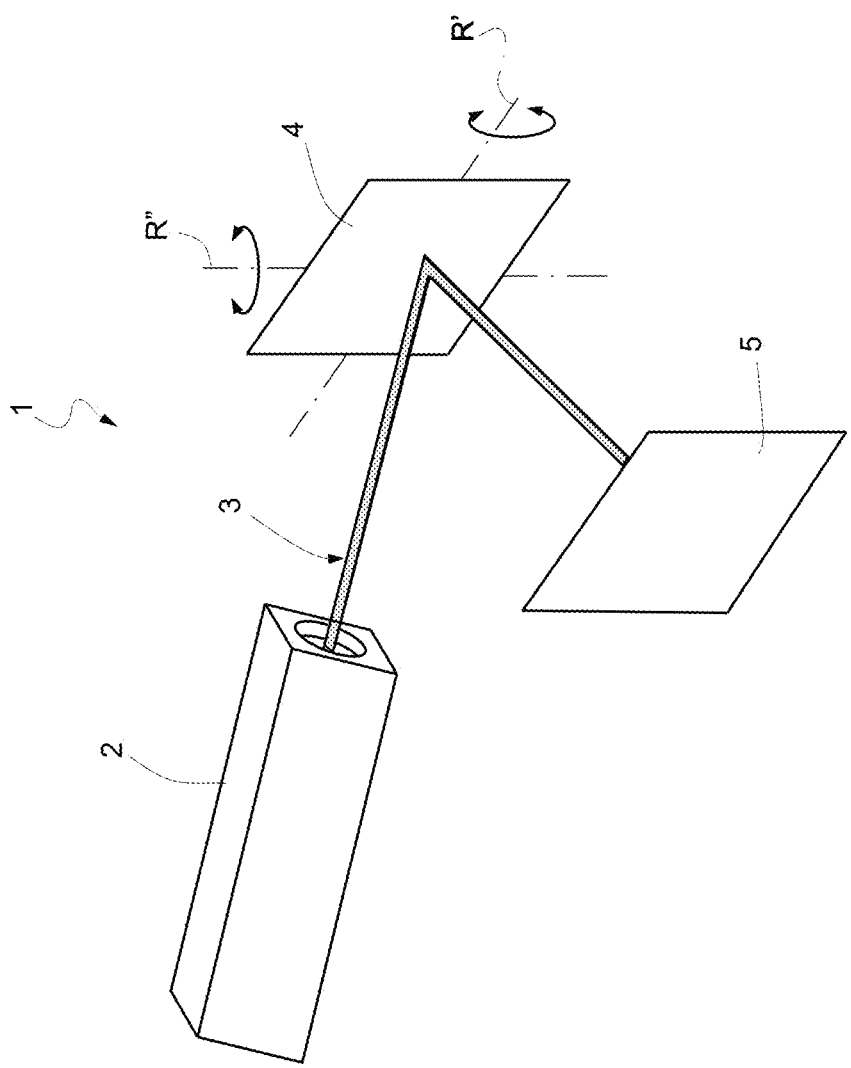
FIG. 1 is a perspective schematic representation of a known picoprojector.
Figure 2:
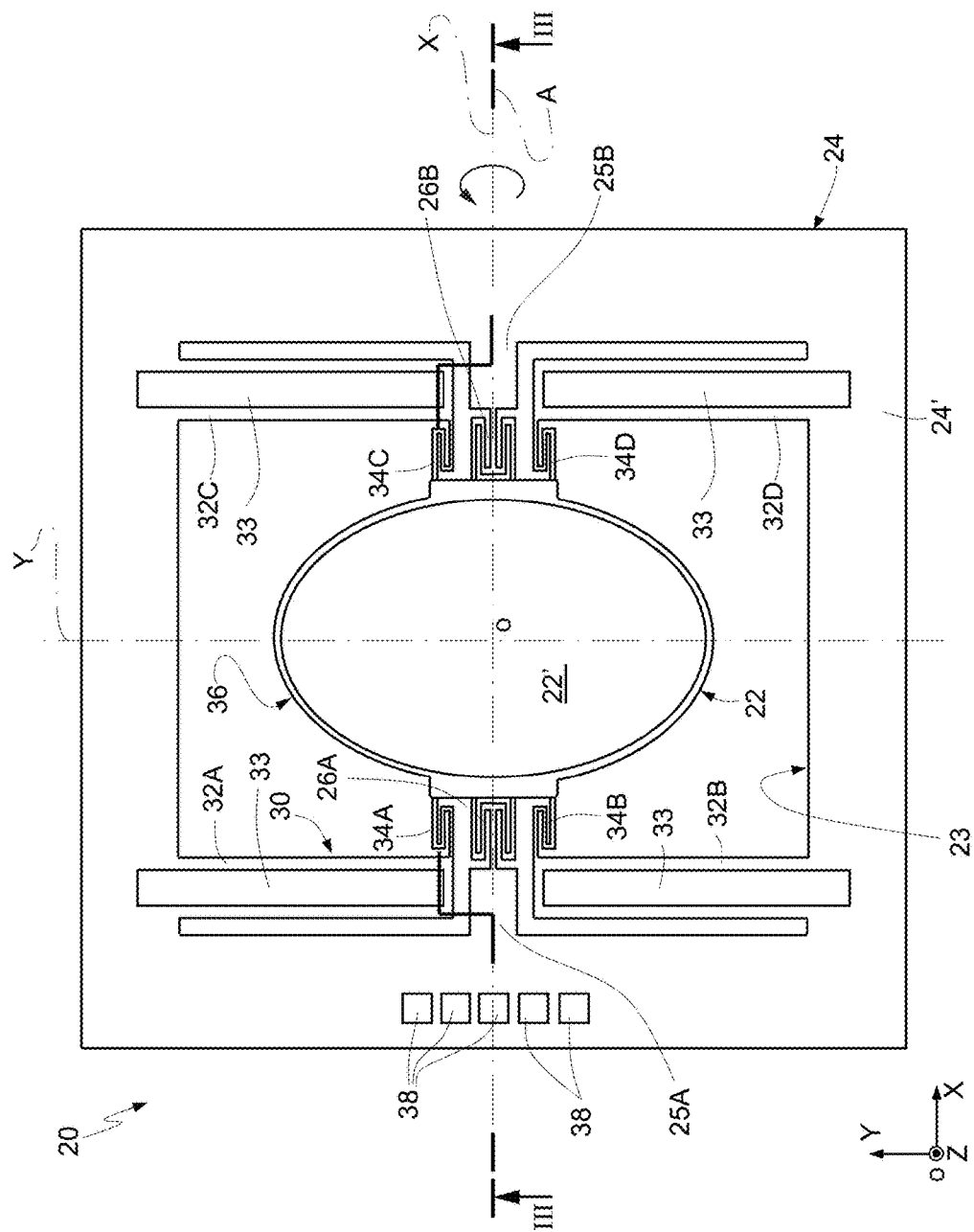
FIG. 2 is a top plan view of a microelectromechanical mirror device.
Figure 3:
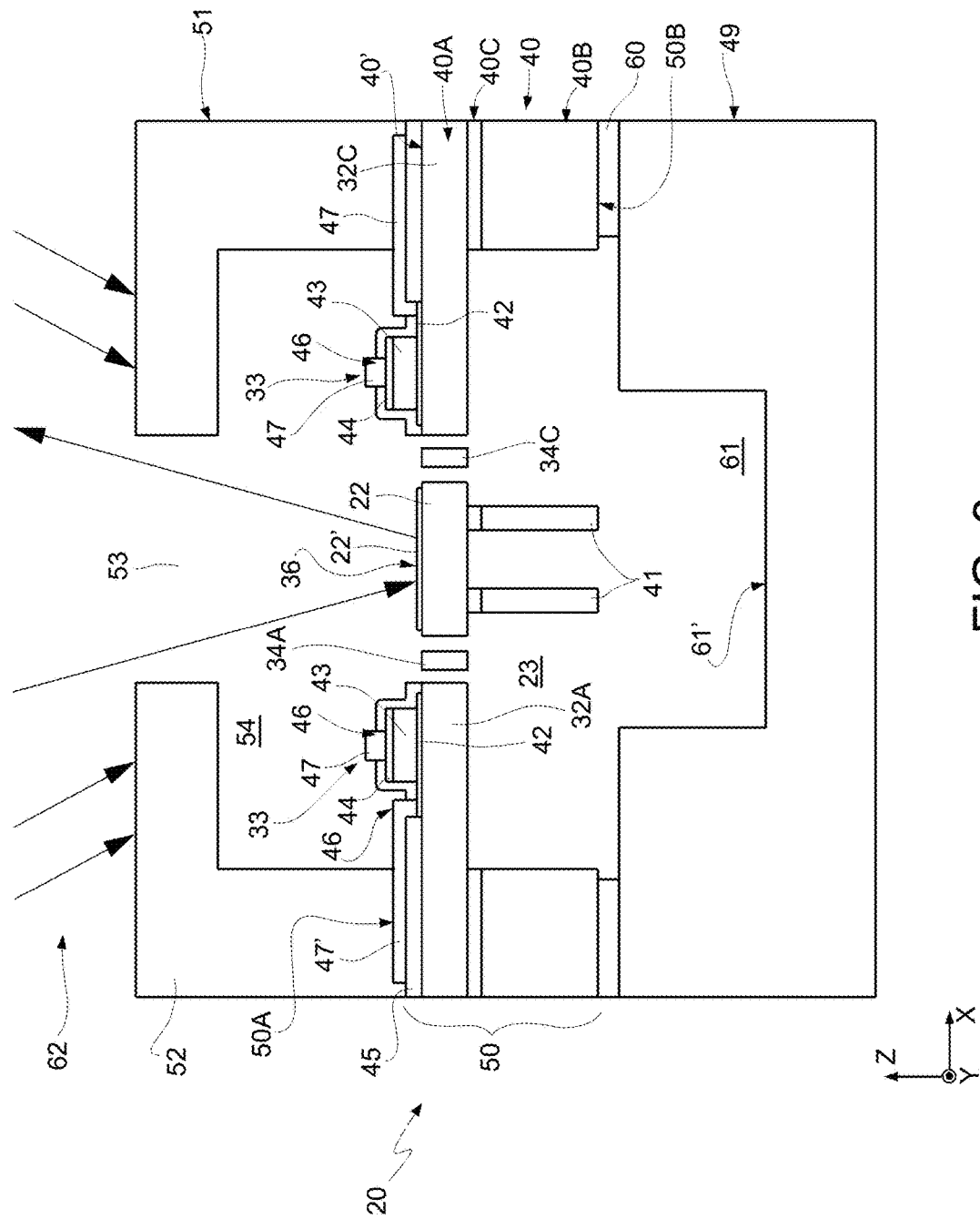
FIG. 3 is a cross-sectional view of the device of FIG. 2, taken along the line of section III-III.

In particular, the manufacturing steps described below allow a microelectromechanical mirror device to be obtained having a general structure similar to the one illustrated in FIGS. 2 and 3 (but with substantial improvements made) and described briefly hereinafter. In particular, FIGS. 4, 5A-5H, and 6-9 refer to intermediate structures sectioned along lines of section corresponding to the line III-III of FIG. 2.

Figure 4:
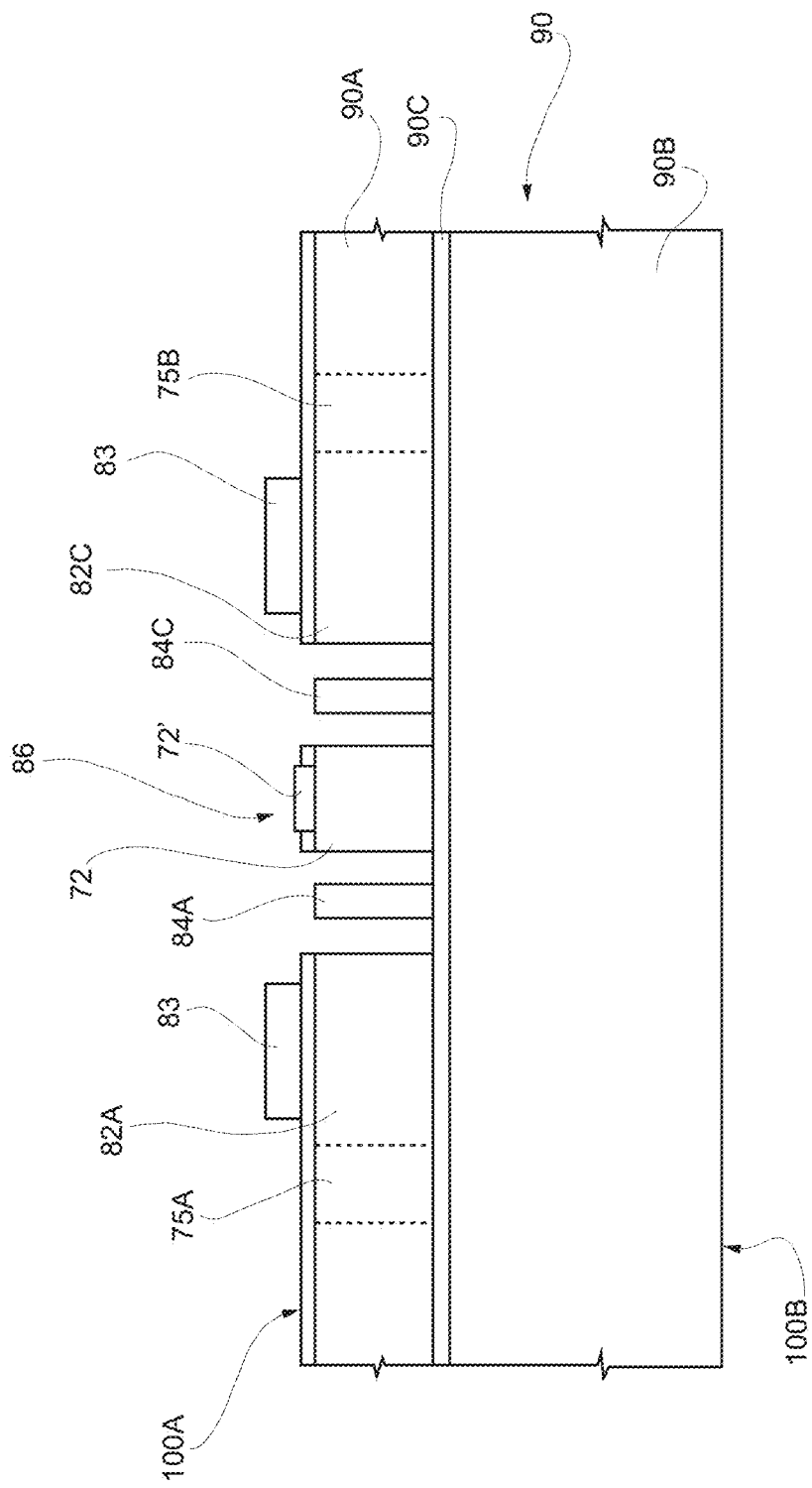

FIG. 4 shows a SOI wafer 90 having a first surface 100A and a second surface 100A, 100B and comprising a first structural layer 90A and a second structural layer 90B, which are, for example, made of silicon, and an intermediate insulating layer 90C, which is, for example, made of silicon oxide. The SOI wafer 90 has already been subjected to first manufacturing steps that lead to formation, within the first structural layer 90A, of actuation regions 83 (which comprise bottom-electrode regions, top-electrode regions, a passivation layer, contact openings, and metal routing regions, similar to the homologous structures of FIG. 3 and here not illustrated). Moreover, by chemical etching of the first structural layer 90A of the SOI wafer 90, there have already been defined a tiltable structure 72; supporting elements 75A, 75B similar to the supporting elements 25A, 25B of FIG. 2, here visible only in part and delimited by a dashed line; elastic suspension elements similar to the elastic suspension elements 26A, 26B illustrated in FIG. 2 (here not illustrated); four driving arms (here just two driving arms 82A, 82C are visible); and four elastic decoupling elements, of which only two elastic decoupling elements 84A and 84C are visible. In addition, a reflective surface 72' has already been formed on top of the tiltable structure 72, forming a mirror structure 86.

Separately, a cap wafer 10, made of semiconductor material, for example silicon, comprising a work substrate 10' and an insulating layer 10", for example of silicon oxide is machined, as shown in FIG. 5A. The work substrate 10' has a first work surface 10A, set between the work substrate 10' and the insulating layer 10", and a second work surface 10B, opposite to the first work surface 10A.

In FIG. 5B, a first opening 11' is obtained in the insulating layer 10" via known lithographic steps and chemical-etching steps.

A masking region 12 is then formed on top of the first work surface 10A and on top of the insulating layer 10" of the cap wafer 10, via deposition and lithographic definition of a masking layer (for example, a resist layer); the masking region 12 forms an inner second opening 11", for example concentric to the first opening 11' (FIG. 5C).

Figure 5D:
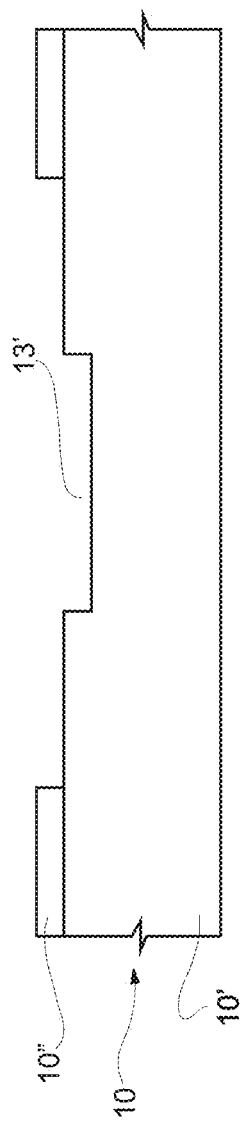

Via a first chemical etching and using the masking region 12, part of the work substrate 10' is removed, for example for a depth of 50 μm, in a region corresponding to the second opening 11", to create a first recess 13'. The masking region 12 is then removed (FIG. 5D).

Using the remaining portions of the insulating layer 10" as a mask, a second chemical etching is carried out that further removes, for example for a depth of 100 μm, part of the work substrate 10', making the first recess 13' deeper and creating a second recess 13", wider than the first recess 13'. In practice, the first and second recesses 13', 13" are arranged underneath the first opening 11', illustrated in FIG. 5B. The remaining portions of the insulating layer 10" are then removed to obtain the intermediate structure of FIG. 5E. The remaining portions of the first surface 10A of the work substrate 10' (FIG. 5A) form a temporary-contact surface 14 of the work substrate 10', which has a smaller area than the first surface 10A and surrounds the second recess 13". The angle α, defined between a bottom surface 13A of the second recess 13" and a side wall 13B of the first recess 13', which in FIG. 5E is 90°, can have values comprised between 10° and 90° according to the specific chemical etching used and the desired profile of the opening for passage of the light beam (onto the reflective surface 72' illustrated in FIG. 4) in the final device, according to the application.

Figure 5E:
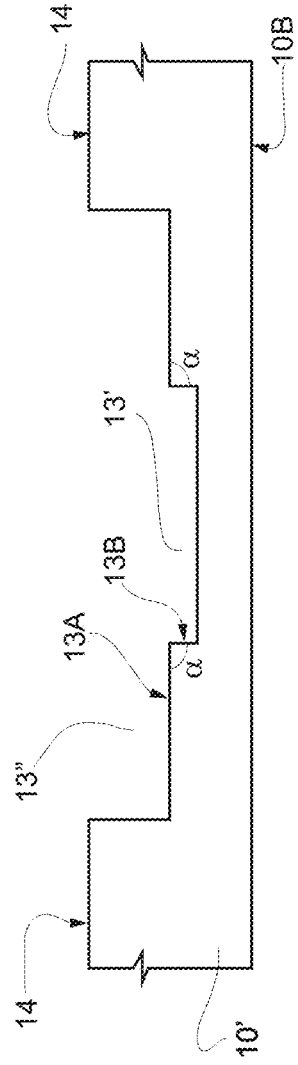
Figure 5F:
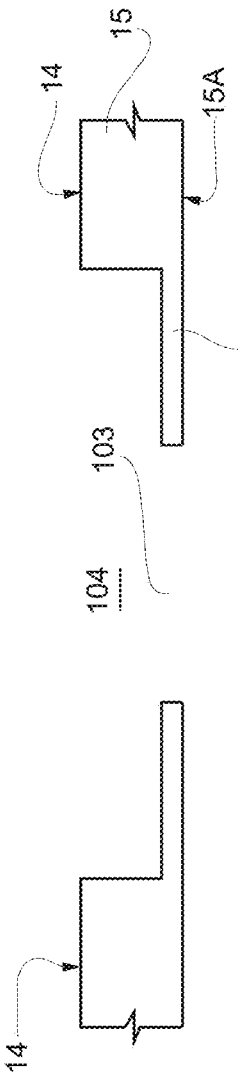
Figure 9:
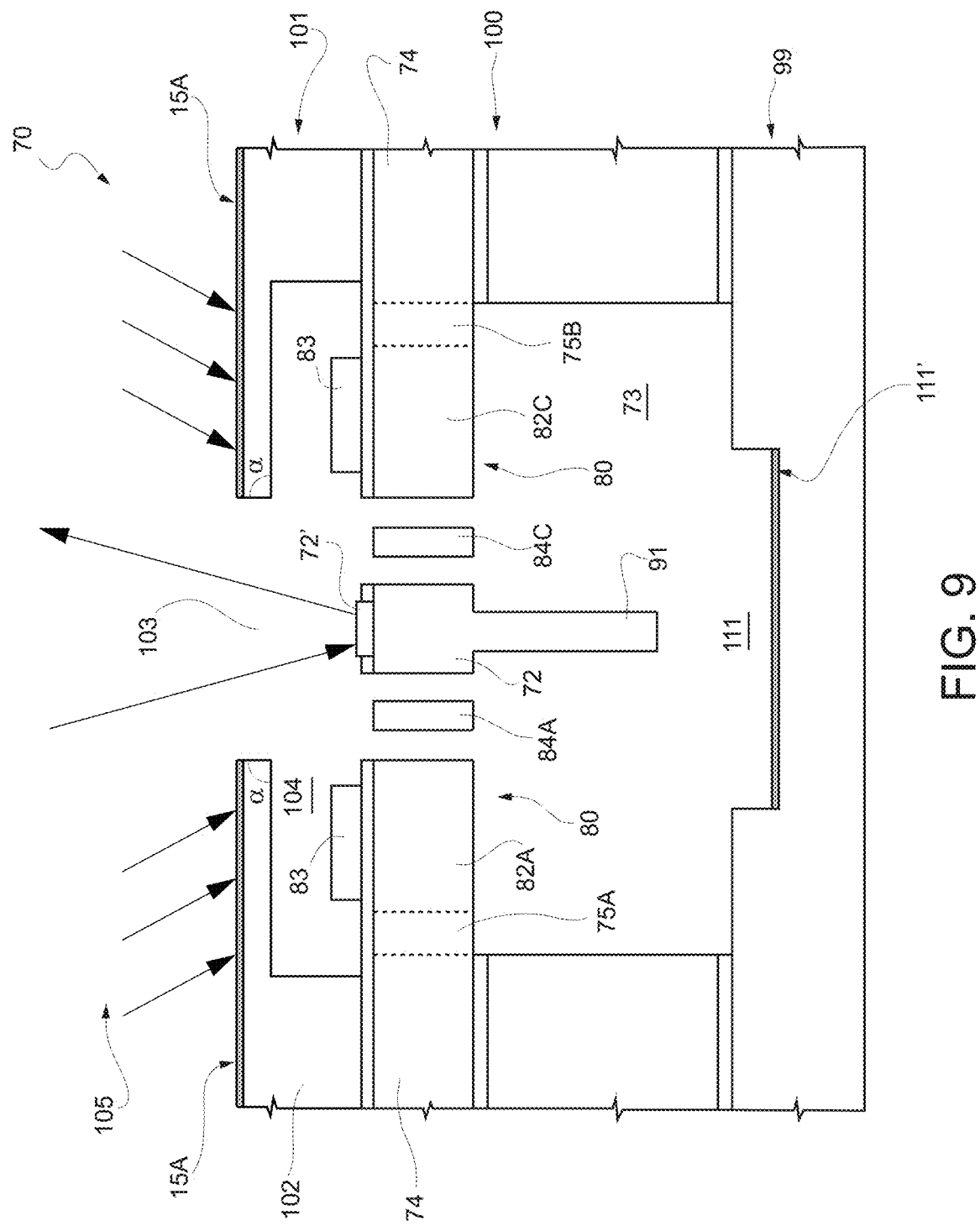

The work substrate 10' of FIG. 5E undergoes a thinning step, for example through a grinding process, as illustrated in FIG. 5F. To carry out this thinning process, the work substrate 10' is conveniently supported according to techniques known to the person skilled in the art, for example by temporary bonding between the work substrate 10', and a supporting wafer (here not illustrated), at the temporary-contact surface 14. In particular, the bonding process may envisage possible intermediate layers of material that facilitate the above process, in a way that is also known. In particular, the thinning process is carried out from the back, starting from the second work surface 10B of FIG. 5E and proceeds until the first recess 13' is reached, to obtain a thinned substrate 15, having an outer surface 15A. Following upon the thinning step, the second recess 13" forms a chamber 104 delimited underneath by a bottom wall 102, and the first recess 13' becomes a through recess and forms an opening 103 for the passage of light beams in the finished microelectromechanical device (FIG. 9).

Next, with reference to FIG. 5G, the outer surface 15A of the thinned substrate 15 undergoes a blackening process to make the outer surface 15A absorbant or diffusive in regard to light. For instance, the outer surface 15A may undergo an oxygen plasma etching ($O_2$) or to laser etching, or some other work process such as to increase the roughness thereof, in a way known to the person skilled in the art. Alternatively, in a way equally known to the person skilled in the art, the outer surface 15A may be coated with thin layers of light absorbing materials or with dielectric multilayers designed for suppressing the reflected component of light.

The thinned substrate 15 is then temporarily bonded to a temporary supporting wafer 16 via a layer of adhesive material 17, with the layer of adhesive material 17 facing the outer surface 15A of the thinned substrate 15 and the opening 103 (FIG. 5H).

Figure 6:
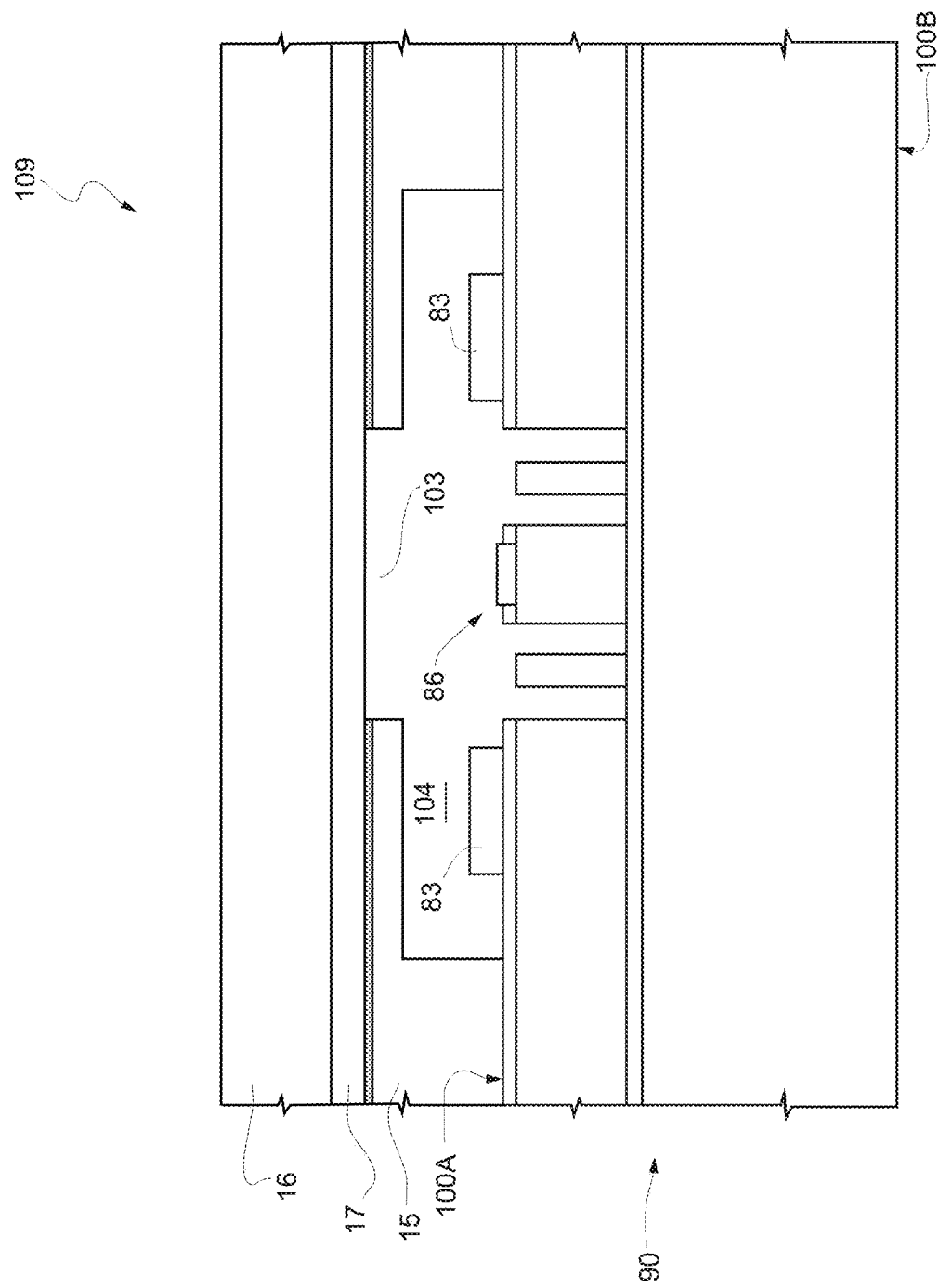

In FIG. 6, the thinned substrate 15 is turned over and bonded on the first surface 100A of the SOI wafer 90 of FIG. 4 in such a way that the chamber 104 surrounds and houses the actuation regions 83, and the opening 103 is aligned with, and faces, the mirror structure 86. A first composite wafer 109 is thus formed.

Figure 7:
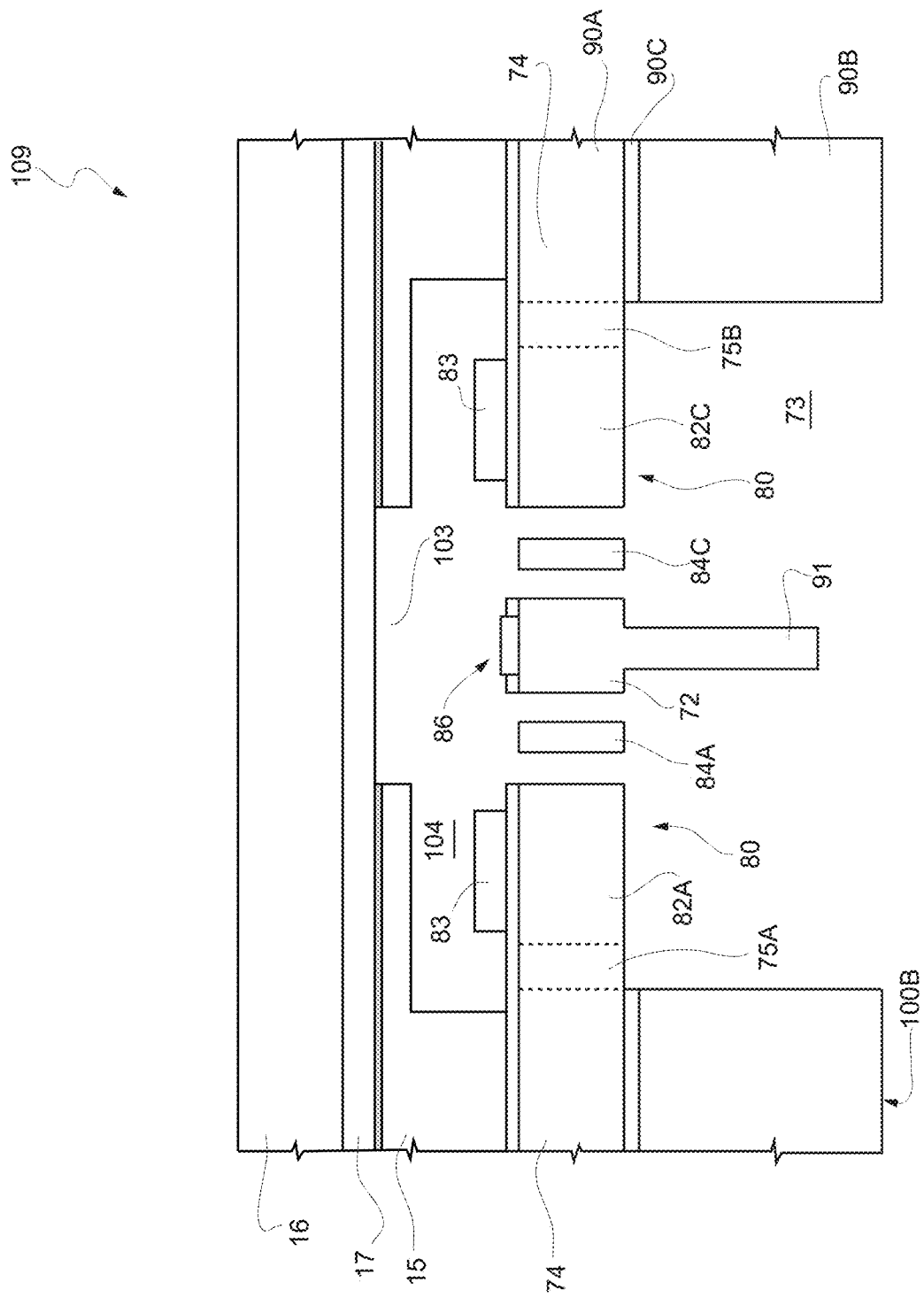

In FIG. 7, the first composite wafer 109 undergoes chemical etches, starting from the second surface 100B of the SOI wafer 90 (which now delimits the first composite wafer 109 and hence will also be referred to as bottom surface 100B of the first composite wafer 109). In particular, the second structural layer 90B of the SOI wafer 90 and the intermediate insulating layer 90C are selectively removed to create a cavity 73 that delimits underneath, and releases, the tiltable structure 72, the driving arms 82A, 82C (as well as the other two arms corresponding to the driving arms 32B, 32D of FIG. 2, here not visible), the elastic decoupling elements 84A and 84C, the supporting elements 75A, 75B (visible only in part and delimited by a dashed line in FIG. 7), and elastic suspension elements similar to the elastic suspension elements 26A, 26B illustrated in FIG. 2 and here visible. Each driving arm (here, 82A, 82C) forms, together with the respective actuation region 83, an actuation structure 80. In this step, reinforcement elements 91 are also formed, which extend from the tiltable structure 72 within the cavity 73. Finally, in this step, a fixed structure 74 is defined, which surrounds the cavity 73 and is delimited in FIG. 7 by a dashed line.

Figure 8:
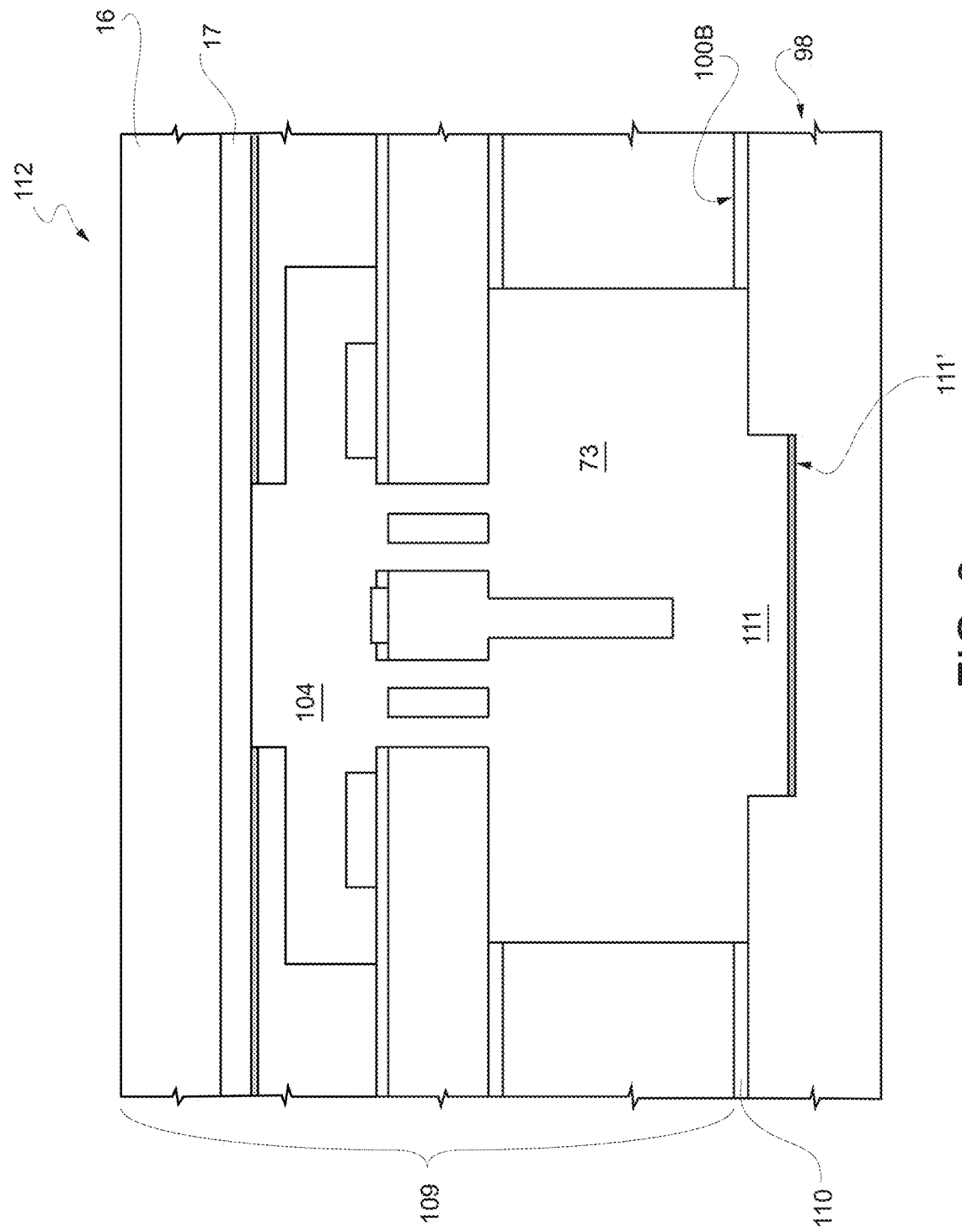

In FIG. 8, a supporting wafer 98 is bonded to the remaining portions of the bottom surface 100B of the first composite wafer 109 by a bonding layer 110 to form a second composite wafer 112. The supporting wafer 98 has been previously machined, in a way similar to what has been described with reference to FIG. 3, to form a rear recess 111 having a bottom surface 111' which is blackened. In particular, the supporting wafer 98 is bonded in such a way that the rear recess 111 is located at the cavity 73, facing and underneath the tiltable structure 72.

Finally, as shown in FIG. 9, the temporary supporting wafer 16 and the layer of adhesive material 17 are removed, and the second composite wafer 112 is diced to obtain a microelectromechanical mirror device 70. The microelectromechanical mirror device 70 thus comprises a sensor body 100, a protective cap 101, and a supporting body 99, obtained, respectively, from the SOI wafer 90, the cap wafer 10, and the supporting wafer 98.

Figure 10:
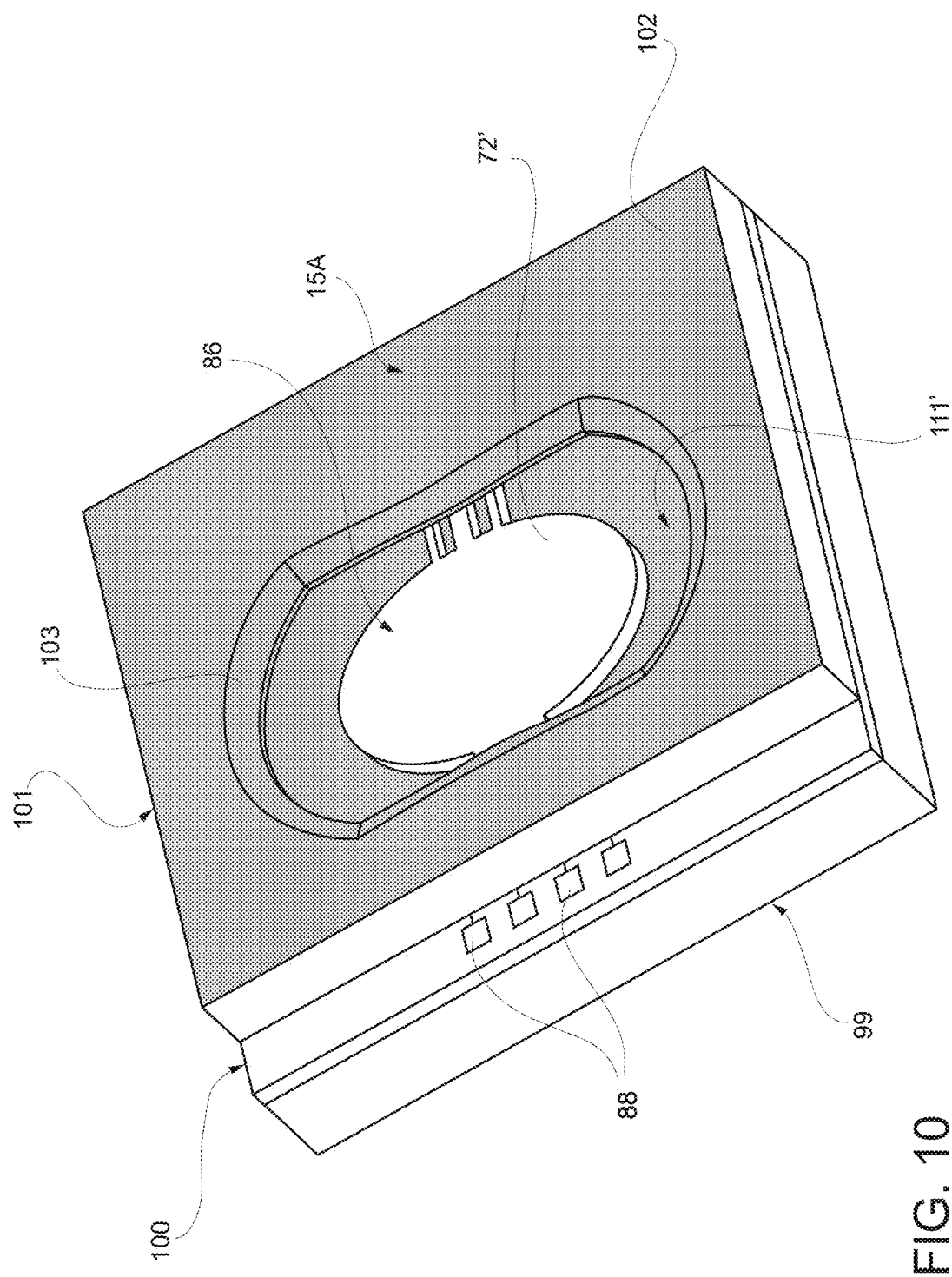
FIG. 10 is a perspective view of the microelectromechanical mirror device disclosed and described herein.

The resulting microelectromechanical mirror device 70 is illustrated also in FIG. 10. In detail, FIG. 10 shows the protective cap 101 bonded to the sensor body 100, with the opening 103 aligned to the mirror structure 86 and to the bottom surface 111', which is blackened, of the supporting body 99. The protective cap 101 hence covers the actuation structures 80 (here not visible), leaving the control pads 88 free.

In this way, the sensor body 100, the protective cap 101, and the supporting body 99 may be obtained using the technologies and machines for semiconductor work, in one and the same factory.

Manufacturing the protective cap 101, now integrated in the process cycle as described above, moreover makes it possible to carry out the blackening of the outer surface 15A using efficient techniques, in particular in the case where the protective cap 101 is made of silicon. In this way, the outer surface 15A can absorb or diffuse the light beams 105 incident thereon, preventing undesired spurious reflections. In this way, the radiation reflected by the microelectromechanical device 70 is determined only by the light beams 105 reflected by the reflective surface 72'.

Furthermore, the described manufacturing process allows for high freedom in the choice of the value of the angle α; in this way, it is possible to select in a controlled way the angle of incidence of the light beams 105 onto the tiltable structure 72, helping guarantee better control of operation of the microelectromechanical mirror device 70.

The techniques described herein also help guarantee a high versatility in manufacturing the protective cap 101, preventing problems of alignment of the opening 103 with the tiltable structure 72 during post-manufacture back-end bonding, and hence possible malfunctioning of the microelectromechanical mirror device 70 during operation.

Figure 11:
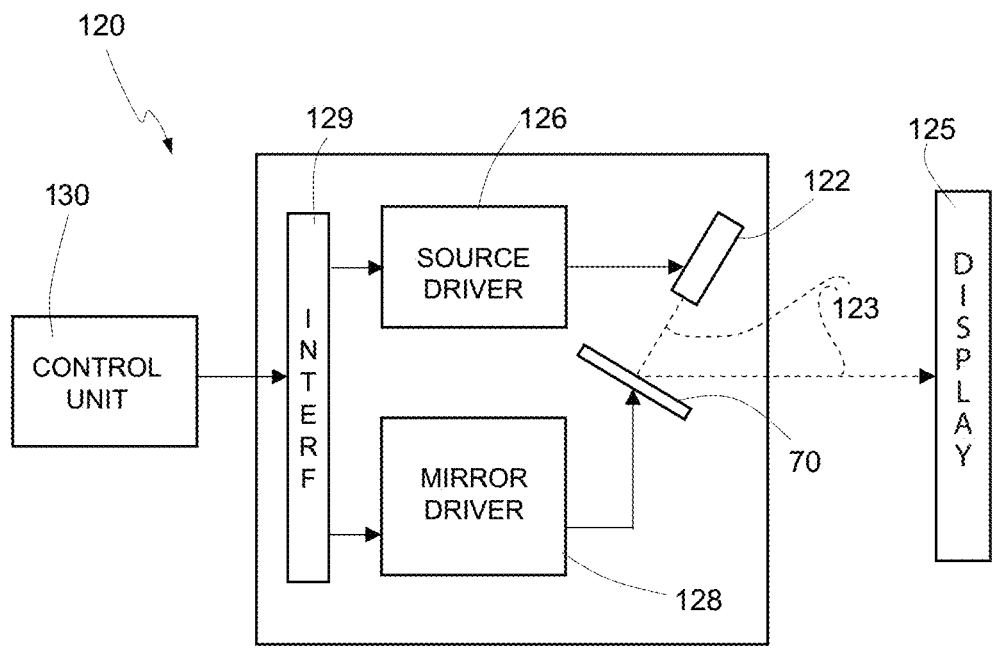
FIG. 11 is a block diagram of a picoprojector that uses the microelectromechanical mirror device disclosed and described herein.
Figure 12:
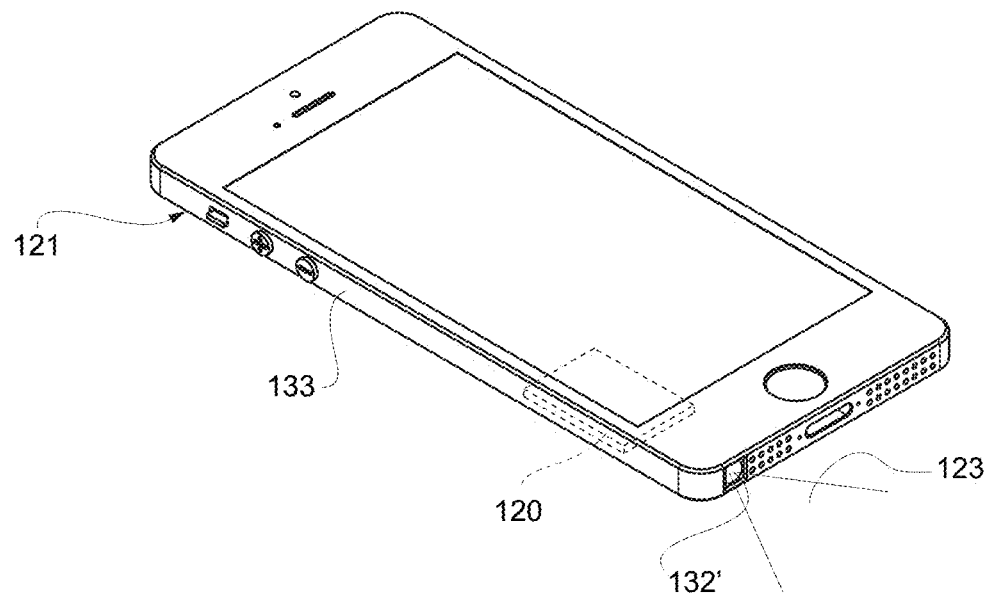
FIG. 12 is a perspective view regarding a possibility of coupling between the picoprojector of FIG. 10 and a portable electronic apparatus.
Figure 13:
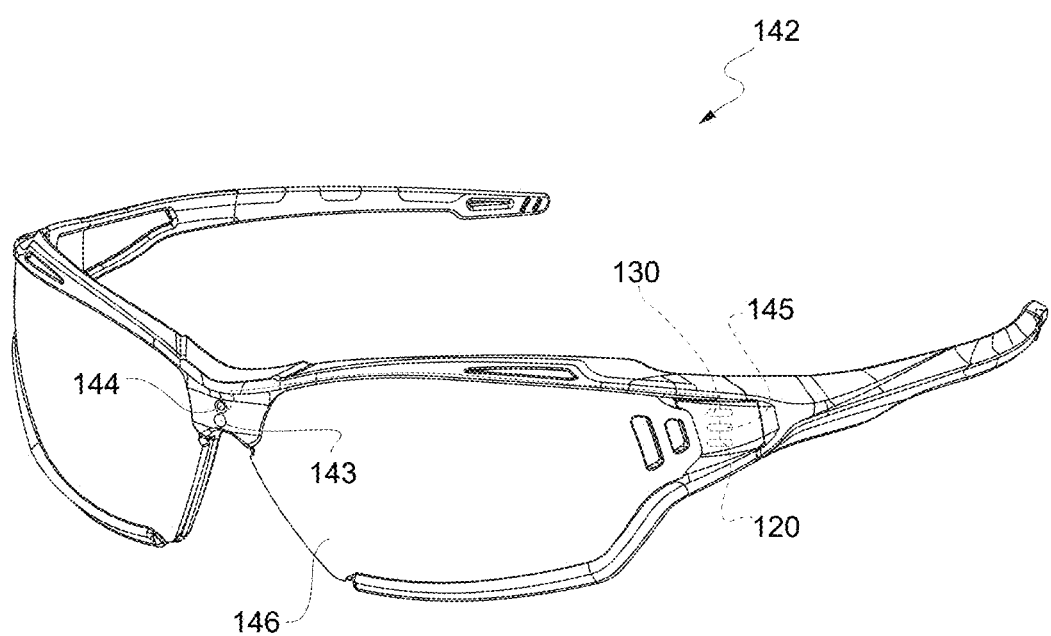
FIG. 13 is a perspective view regarding a possibility of coupling between the picoprojector of FIG. 10 and an augmented-reality viewing system.

The microelectromechanical device 70 can be used in a picoprojector 120 designed to be functionally coupled to portable electronic apparatuses, as illustrated schematically in FIGS. 11-13.

In detail, the picoprojector 120 of FIG. 11 comprises a light source 122, for example a laser light source, designed to generate a light beam 123; the microelectromechanical mirror device 70, designed to receive the light beam 123 and to direct it toward a screen or display surface 125 (external to and set at a distance from the picoprojector 120 itself); a first driving circuit 126, designed to supply appropriate control signals to the light source 122, for generation of the light beam 123 as a function of an image to be projected; a second driving circuit 128, designed to supply driving signals to the microelectronic device 70; and a communication interface 129, designed to receive, from an external control unit 130, for example included in the portable apparatus 121, information on the image to be generated, for example in the form of a pixel array. This information is sent at input for driving the light source 122.

The picoprojector 120 may be obtained as a separate and stand-alone accessory with respect to an associated portable apparatus or may be integrated therein.

Consider, for example, FIG. 12, where the picoprojector 120 is arranged within a casing 133 of a portable electronic apparatus 121. In this case, the portable electronic apparatus 121 has a respective portion 132' transparent to the light beam 123 coming from the microelectronic device 70. The picoprojector 120 is in this case for example coupled to a printed-circuit board present within the casing 133 of the portable electronic apparatus 121.

In another configuration, thanks to the excellent optical properties of the present microelectromechanical device 70, this can be integrated safely for the user also in a viewer 142 configured for being worn at a close distance from the eyes and for providing augmented-reality or virtual-reality images, as illustrated in FIG. 13. In detail, the viewer 142 comprises, for example, sensors 143, 144 for recording both the reality external to the user and movements of the user himself, such as movements of his hands or gaze. The information gathered by the sensors 143, 144 can be processed by a processing unit 145 and supplied to the control unit 130 for projecting images specific to the desired application by means of the picoprojector 120 on a lens 146 operating as screen.

Finally, it is clear that modifications and variations may be made to the microelectromechanical mirror device 70 and to the manufacturing process described and illustrated herein, without thereby departing from the scope of the present invention, as defined in the annexed claims.

For instance, the mirror structure, the elastic suspension elements and the actuation system may have different shapes. Moreover, the protective cap may be manufactured starting from different materials, for example glass, using different blackening processes and may have a different shape. In addition, the opening of the protective cap may be obtained using different processes either of a mechanical type or of a chemical type, for example via deep chemical etching.

The actuation system may be different, and may even not be a piezoelectric system.

The invention claimed is:

1. A process for manufacturing an optical microelectromechanical device, comprising:

forming, in a stacked arrangement, a work substrate and an insulating layer, the work substrate having a first work surface facing the insulating layer;

forming a first opening in the insulating layer;

forming a mask on top of the first work surface and the insulating layer to thereby form a second opening defined by the mask and being concentric with the first opening;

removing part of the work substrate in a region corresponding to the second opening to create a first recess, and removing the mask thereafter;

removing part of the work substrate to deepen the first recess and create a second recess surrounding the first recess and being wider than the first recess;

removing remaining portions of the insulating layer to obtain an intermediate structure, with remaining portions of the first work surface of the work substrate forming a temporary contact surface having a smaller area than the first work surface and surrounding the second recess;

thinning the work substrate while supporting the work substrate by temporarily bonding the work substrate to a supporting wafer at the temporary contact surface, the thinning serving to turn the second recess into a chamber delimited underneath by a bottom wall and serving to turn the first recess into a through recess;

blackening an outer surface of the thinned work substrate;

bonding the thinned work substrate to another temporary supporting wafer, with the bonding facing the outer surface of the thinned work substrate;

flipping the thinned work substrate and bonding the thinned work substrate on a first surface of a silicon-on-insulator wafer; and removing the temporary supporting wafer.

2. The process of claim 1, wherein the first opening is formed in the insulating layer by lithography and chemical etching.

3. The process of claim 1, wherein the mask comprises a resist layer, the resist layer being formed via deposition and lithographic definition.

4. The process of claim 1, wherein the part of the work substrate is removed in the region corresponding to the second opening via chemical etching to create the first recess.

5. The process of claim 4, wherein the part of the substrate removed has a first depth.

6. The process of claim 5, wherein the part of the work substrate is removed via chemical etching to deepen the first recess and create the second recess.

7. The process of claim 6, wherein the part of the work substrate removed to deepen the first recess and create the second recess has a second depth greater than the first depth.

8. The process of claim 1, wherein an angle defined between a bottom surface of the second recess and a sidewall of the first recess is between 10° and 90°.

9. The process of claim 1, wherein thinning the work substrate is performed via grinding.

10. The process of claim 9, wherein the grinding is performed from a second work surface of the work substrate opposite the first work surface, toward the first work surface until the first recess is reached.

11. The process of claim 1, wherein temporarily bonding the work substrate to the support wafer at the temporary contact surface is performed by temporarily gluing the work substrate to the support wafer at the temporary contact surface using adhesive.

12. The process of claim 1, wherein the blackening of the outer surface is performed via plasma etching.

13. The process of claim 1, wherein the blackening of the outer surface is performed via laser etching.

14. The process of claim 1, wherein the silicon-on-insulator wafer has a mirror structure defined on the first surface thereof with actuation regions associated therewith; and wherein the bonding of the thinned work substrate on the first surface of a silicon-on-insulator wafer is done in such a way that the chamber surrounds and houses the actuation regions and faces the mirror structure.

* * * * *